United States Patent [19]

Martin

[11] 3,774,078

[45] Nov. 20, 1973

[54] THERMALLY INTEGRATED ELECTRONIC ASSEMBLY WITH TAPERED HEAT CONDUCTOR

[75] Inventor: Jacob H. Martin, Wellesley, Mass.

[73] Assignee: Massachusetts Institute of Technology, Cambridge, Mass.

[22] Filed: Mar. 29, 1972

[21] Appl. No.: 239,240

[52] U.S. Cl. ......... 317/100, 317/101 CM, 174/15 R, 174/DIG. 5

[51] Int. Cl. ............ H05k 7/20

[58] Field of Search ............ 174/DIG. 5, 15 R, 174/16 R; 317/100, 101 CE, 101 CM, 234 A

[56] References Cited

UNITED STATES PATENTS

| | | | |
|---|---|---|---|
| 3,489,952 | 1/1970 | Hinchey | 317/100 |
| 3,325,766 | 6/1967 | Kolb | 339/18 |
| 3,209,208 | 9/1965 | Francis | 317/100 |
| 3,417,458 | 12/1968 | Lob | 29/471.9 |
| 3,018,424 | 1/1962 | Colaiaco | 317/100 X |
| 3,204,157 | 8/1965 | Peterson | 317/234 A |
| 3,403,300 | 9/1968 | Horowitz | 317/101 CM |

FOREIGN PATENTS OR APPLICATIONS

| | | | |
|---|---|---|---|
| 659,585 | 3/1963 | Canada | 174/DIG. 5 |

OTHER PUBLICATIONS

MIT Publication, The Impact of LSI on System Packaging, Jacob H. Martin, Jan. 1970, Charles Stark Draper Laboratory, Figure 10, Page 12.

*Primary Examiner*—Robert K. Schaefer
*Assistant Examiner*—Gerald P. Tolin
*Attorney*—Arthur A. Smith, Jr. et al.

[57] ABSTRACT

Heat is conducted from electronic equipment through tapered thermal conductors.

16 Claims, 4 Drawing Figures

PATENTED NOV 20 1973

3,774,078

THERMALLY INTEGRATED ELECTRONIC ASSEMBLY WITH TAPERED HEAT CONDUCTOR

FIELD OF INVENTION

This invention relates to electronic modules, and in particular to packaging of high power density electronics such as large-scale integrated circuitry (LSI).

BACKGROUND OF INVENTION

Miniaturization of electronic equipment involves not only miniaturization of the circuit components but also the design and assembly of miniaturized components into a total integrated miniaturized system. The capacity of an LSI circuit, which is defined as a silicon chip containing the equivalent of 100 or more gates (or the equivalent of 600 or 700 components), to confine a great number of circuit components in a very small space does not necessarily lead to miniaturized electronic equipment. An approach which fails to consider the interrelation between the circuitry and the interconnections, heat transfer, and mechanical qualities required of the total equipment will not maximize miniaturization. Although the superposition of solutions technique of independently selecting appropriate connection schemes, adding a structural framework to hold these connectors together, and then adding heat transfer structure where required may appear an easy approach to package design, the resultant equipment is not at all the least weight, smallest volume, or lowest cost that could be achieved.

Among the requirements of high density electronics are efficient heat transfer systems. The power dissipation levels of closely interconnected silicon chips may be of the order of 10 watts per cubic inch or even higher, requiring far more powerful cooling techniques than conventional forced air or radiation cooling. If high powered components or modules are interconnected using multi-layered epoxy-glass wire boards, then it may be necessary to extend a thermal conductor through a hole in the board to a heat sink in order to conduct heat away from the components or modules. Such a technique requires increased component or module spacing on the circuit board to make up for the interconnection area lost to heat sink holes, and hence increases the volume required.

For receiving heat from the heat sink for the components or modules conventional "cold plates" have been used. Cold plates tend to be rather heavy structures with relatively large flat areas which are brought into pressure contact with the equipment to be cooled. The cold plate is rugged so that a flat surface can be maintained and so that the pressure between the plate and equipment does not vary too much across the contact area. Unfortunately, in operation the difference in temperature between the cold plate and the equipment can significantly bend or warp the equipment and change the interface pressure.

SUMMARY OF INVENTION

It is an object of this invention to provide lightweight, compact, high-power density, reliable and economical electronic modules and packages.

Another object is to improve heat transfer in electronic equipment and from that equipment to a heat sink with a minimum use of material, or addition of external components, in order to maintain small size and light weight.

A further object is to improve LSI electronic packaging techniques.

Applicant has discovered that substantial weight and volume reduction can be achieved by conducting heat from heat-dissipating electronics into thermal sinks through tapered thermal conductors. In particular, the invention features an electronic assembly comprising an electronic package having heat-dissipating electronics, a thermal sink, and a tapered thermal conductor having a larger end and a smaller end. A tapered chamber is formed in either package or the sink, and the other one (not having the tapered chamber) is thermally connected to this tapered thermal conductor. The conductor is secured within the chamber with heat transfer between the electronic package and the thermal sink being across the interface between the thermal conductor and the tapered chamber. In one embodiment, the tapered thermal conductor is in thermal contact with the end ceramic wiring board of a stacked and electrically interconnected array of such boards and the tapered chamber is in the heat sink. In another embodiment, tapered thermally conducting pins secure a cooling tube to a housing, the pins being secured in tapered chambers in the housing for conducting heat from the housing to the thermal sink defined by the cooling tube (and coolant circulating therein).

DESCRIPTION OF PREFERRED EMBODIMENT

Figure 1:
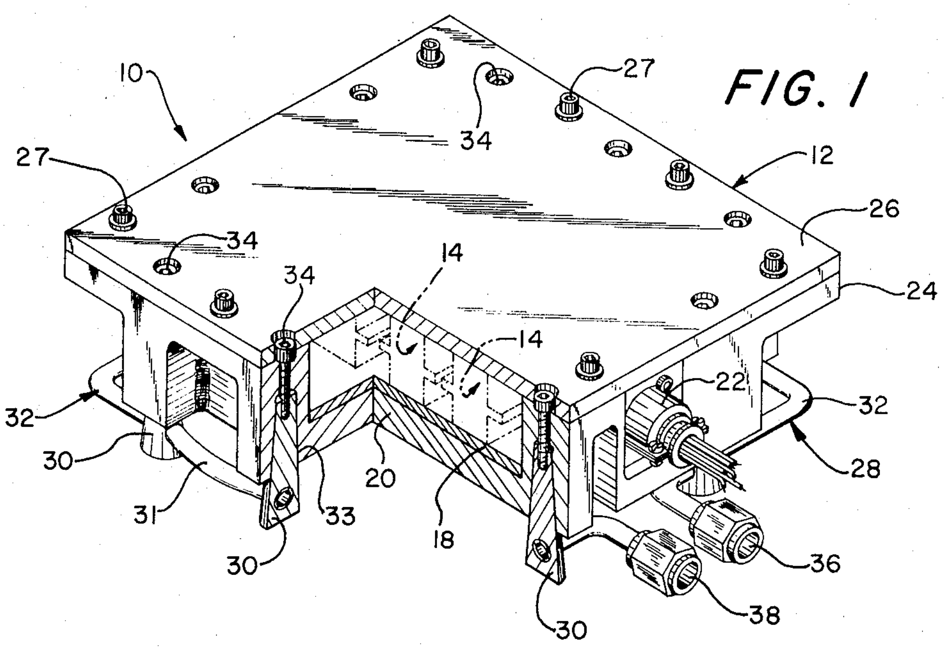
FIG. 1 is an axonometric view, partially broken away, of a diagrammatic representation of an electronic package having a heat transfer system in accordance with the present invention.
Figure 2:
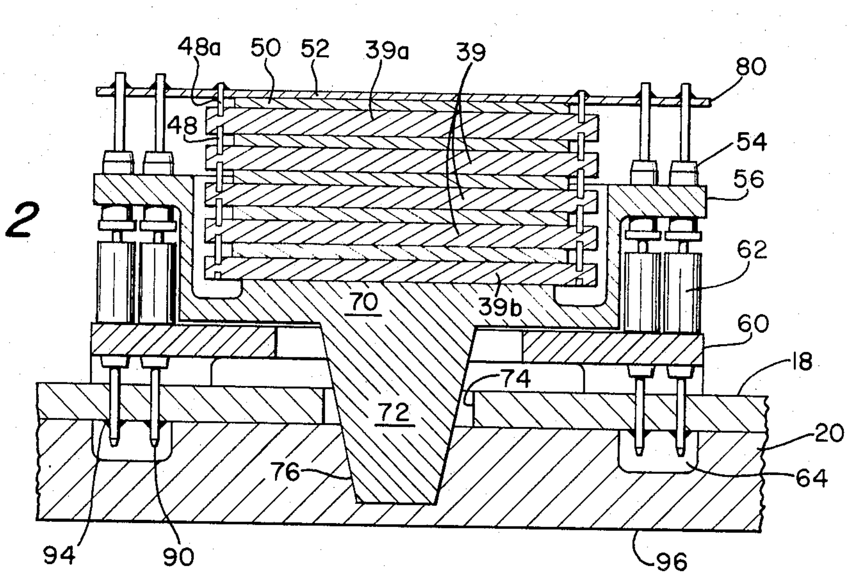
FIG. 2 is a sectional view of one of the electronic modules assembled into the package of FIG. 1, the module being also provided with a heat transfer system in accordance with the present invention.
Figure 3:
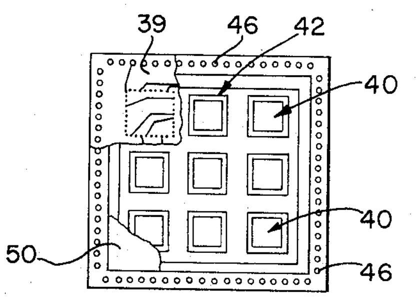
FIG. 3 is a plan view, partially broken away, of one of the multi-chip circuit boards assembled into the module of FIG. 2; and, FIG. 4 is an end view of the board of FIG. 3.
Figure 4:
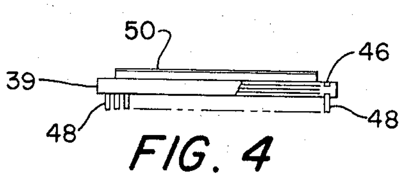

FIG. 1 shows a high density electronic module package 10 having a housing 12 containing a plurality of electronic modules 14 (shown in phantom outline), each of which in turn comprises heat dissipating semiconductor circuits formed of a plurality of multi-layer wiring boards with each board supporting a plurality of silicon chips, as shown in FIGS. 2–4. Each module 14 is mounted on and electrically interconnected to other package components by means of a multi-layer mother wiring board 18 and, as described in more detail with reference to FIGS. 2–4, has a portion extending through mother board 18 into thermal contact with a module thermal sink 20. Power is supplied to mother board 18 from a suitable power supply through connector 22. Housing 12 is formed of a main body portion 24 the lower side of which serves as a thermal sink 20, and a top plate 26, which is secured to main body portion 24 by a plurality of fasteners 27. A housing thermal sink is defined by a thermally conductive (e.g. aluminum) cooling tube 28 (and coolant flowing therein). Tube 28 extends through and is brazed to a plurality of tapered heat transfer pins 30. Tube 28 has a plurality of stress relief bends 31 (of which only one is shown), between adjacent pins 30 along each side of housing 12. At the corners 32 of tube 28, the bends normally formed there serve as stress relief bends between each two end pins 30. Tapered chambers 33 in housing 12 are sized to receive the smaller end of the respective pins 30. Mounting screws 34 extend between the top plate 26 of housing 12 and pins 30. Coolant fluid enters cooling tube 28 through inlet 36 and is discharged through outlet 38. The truncated conical interface between each pin 30 and each chamber 33 not only provides a large surface area for heat transfer, but, by reason of the tapered construction, enables large surface pressures to be applied, further improving the coefficient of heat transfer between the surfaces. These pins, as well as the housing 12, are preferably formed of aluminum or magnesium, which are very lightweight materials.

In addition to providing a large heat transfer area while taking up a small actual volume, the tapered heat transfer pins 30 also serve the purpose of mounting the cooling tube to the housing, and so at the same time lend both structural and heat transfer advantages. This combination of a cooling tube, coolant and mounting pins possesses great weight and size advantages over prior cold plates with the equipment rigidly mounted thereto. The cooling tube can bend between the tapered pins, thus essentially eliminating the warping tendency of the equipment.

Referring now to FIGS. 2–4, each electronic module 14 consists of five ceramic multi-layer module wiring boards 39 which are shown in detail in FIGS. 3 and 4. Cermaic (alumina) boards are preferred over epoxy-glass boards because of their heat conductivity, their hermeticity and the ability to make conductor paths and holes therein in smaller geometries. Each one-inch square module wiring board 39 accommodates nine 140-mil square LSI (silicon) chips 40, each of which is contained in an appropriate chip cavity 42 in board 39. Each board 39 can typically have 2 to 10 layers of circuitry, with 1 to 10 mil thick alumina layers between wiring planes. The wiring is conventionally of tungsten, platinum, molymanganese or the like. Spaced around the upper and lower periphery of each mother wiring board 18 are 72 metallized pin cavities 46, sized to receive 72 input/output (I/O) pins 48. The conducting surfaces of the opposed pin cavities are electrically connected to the internal circuitry of the boards. Each cavity 46 is filled with solder, and the pins 48 of the adjacent board are soldered into these cavities, using oven soldering, infrared, or other soldering techniques. A hermetic cover 50 seals the chips.

It will be observed that the LSI chips 40 and the internal wiring of each wiring board 39 are designed so that all of the required interconnections to and from the boards are made by the pins 48. The pins **48*a* of the uppermost wiring board 39*a* are soldered to a single-layer wiring board 52. Wiring board 52 in turn has appropriate conductors for connecting pins 48 to male connectors 54, located on male header 56. Female header 60 contains a plurality of female connectors 62 adapted to receive the appropriate male connectors 54. Female connectors 62 extend into mother board 18 and therethrough into openings 64 in thermal sink 20. The female and male connectors are detachably connectible so that the entire male header and supported modules may be removed from the female header for repair, reconstruction, substitution, and the like of one or all of the modules 14. The lowermost module wiring board 39*b* is in thermal contact with a square heat transfer plate 70 on male header 56, which has a tapered thermal conductor 72 extending through a hole 74 in mother board 18 into a tapered cavity 76 in module thermal sink 20. A layer of thermal grease is disposed within the cavity 76 between it and the tapered thermal conductor 72. Conductor 72 has opposed tapered planar sides, and a total surface area in contact with heat sink 20 at least as large as the area of square base 70, so as, for the same clamping pressure, to reduce the temperature drop across the interface and thus increase the heat dissipation efficiency of base 70. Because of this increased efficiency, a smaller surface area in conductor 72 than that of base 70 would be sufficient to maintain the same heat dissipation efficiency as base 70. By utilizing tapered conductor 72, the required hole in mother board 18** is greatly reduced, making available more mother board for interlayer wiring and therefore ultimately reducing the space between adjacent electronic modules. Such tapered conductors enable large interface pressures between the conductors and the thermal sink which in turn increase the coefficient of heat transfer at the interface.

Primary heat transfer is through the pins 48, into plate 70, and through tapered conductor 72 into thermal sink 20 (although some heat transfer will also occur through the common I/O pins 48, single layer wiring board 52, and the interconnected male and female connectors). From thermal sink 20, heat is conducted to housing 12, and hence through tapered heat transfer pins 30 to cooling tube 28 and the coolant circulating therein.

The total package design thus involves interrelated design components. The tapered heat transfer pins 30 as shown in FIG. 1 add to the structural stability of the structure as well as providing good heat transfer. In each module 14 itself, the arrangement of LSI chips and the circuitry in each of the module wiring boards 39 enables the use of a small number of I/O pins 48 extending consecutively through each of the circuit boards. The I/O pins in turn serve also as thermal conductors. Further, the tapered thermal conductor 72 reduces the size of the hole required for heat transfer through the mother board into the thermal sink 20, therefore leaving more space available for wiring within the mother board and again decreasing the amount of space necessary between the neighboring modules.

In lieu of having the tapered pin on the plate 70 and the tapered hole in the heat sink, obviously the pin could be formed on the heat sink and the hole in the plate. Also, in lieu of a tapered sided pin as illustrated, a wedge could be substituted, with the tapered hole in the heat sink or plate changed to an appropriately sized groove.

Other embodiments will occur to those skilled in the art and are within the following claims.

What is claimed is:

1. An electronic assembly comprising an electronic package having heat dissipating electronics, a thermal sink, and a tapered thermal conductor having a larger end and a smaller end, one of said package and said sink being thermally connected to a tapered chamber, and the other being thermally connected to said thermal tapered conductor, said conductor being secured in said chamber with heat transfer between said package and said sink being across the interface between said conductor and said chamber, and a circuit board having means for electrically connecting it to said heat dissipating electronics, said tapered thermal conductor extending through an aperture in said circuit board into said tapered chamber.

2. The electronic assembly of claim 1 wherein said tapered chamber is formed in said thermal sink.

3. The electronic assembly of claim 1 wherein said heat-dissipating electronics comprises a plurality of heat-dissipating semiconductor circuits stacked and thermally interconnected, said circuits being connected to common electrical connectors, and said circuit board having means for receiving said common electrical connectors, the end circuit of said stack being thermally connected to said tapered thermal conductor.

4. The electronic assembly of claim 1 wherein said heat-dissipating electronics comprises a plurality of semiconductor circuits disposed on a plurality of wiring boards in thermal contact therewith, said wiring boards being stacked and thermally interconnected and having common electrical conductors, and said circuit board having means for receiving said common electrical connectors, and end wiring board of said stack being thermally connected to said tapered thermal conductor.

5. The electronic assembly of claim 3 wherein said semi-conductor circuits are LSI chips, a plurality of said chips being arranged on the planar surface of each said wiring board.

6. The electronic assembly of claim 3 including an intermediate planar thermal conductor located between said circuit board and said end wiring board and in thermal contact with said end wiring board along one planar surface, said tapered conductor being secured at its large end to the opposite planar surface of said intermediate thermal conductor.

7. The electronic assembly of claim 6, wherein said tapered thermal conductor has two opposed tapered sides.

8. The electronic assembly of claim 1 wherein said heat-dissipating electronics comprises a plurality of heat-producing semiconductor circuits, stacked and thermally interconnected, said circuits being connected to common electrical connectors, and said package includes mounting structure detachably connecting said common electrical connectors to said circuit board.

9. The electronic assembly of claim 8 wherein said mounting structure includes detachably connectable male and female connector members, each pair of said male and female connector members being arranged with one of said connector members electrically connected to a said common connector and the other electrically connected to said circuit board.

10. The electronic assembly of claim 1 wherein said thermal sink comprises a thermally conductive flexible hollow cooling tube confining a cooling fluid, said tapered chamber being formed in said package.

11. The electronic assembly of claim 10 wherein said cooling tube extends through the large tapered end of said tapered thermal conductor, said conductor being secured in said tapered chamber.

12. The electronic assembly of claim 11 wherein said package includes a thermally conductive housing containing a plurality of tapered chambers and a plurality of said tapered thermal conductors are secured in said chambers.

13. The electronic assembly of claim 11 wherein said tube includes stress relief bends between adjacent thermal conductors.

14. The electronic assembly of claim 11 comprising an intermediate thermal sink between said heat dissipating electronics and said housing.

15. The electronic assembly of claim 13 wherein said intermediate thermal sink has a tapered chamber, and said electronic package includes an intermediate tapered thermal conductor thermally connected to said heat-dissipating electronics, said conductor being secured in said chamber with heat transfer between said electronics and said intermediate thermal sink being across the interface of said tapered chamber of said intermediate thermal sink and said intermediate tapered thermal conductor.

16. The electronic assembly of claim 14 wherein said heat-dissipating electronics comprises a plurality of heat-producing semiconductor circuits stacked and thermally interconnected, said circuits being connected to common electrical connectors, and said circuit board having means for receiving said common electrical connectors, the end circuit of said stack being thermally connected to said intermediate tapered thermal conductor.

* * * * *

UNITED STATES PATENT OFFICE
CERTIFICATE OF CORRECTION

Patent No. 3,774,078 Dated November 20, 1973

Inventor(s) JACOB H. MARTIN

It is certified that error appears in the above-identified patent and that said Letters Patent are hereby corrected as shown below:

On the cover sheet after the title, insert -- The invention described herein was made in performance of work under a NASA Contract and is subject to the provisions of Section 305 of the National Aeronautics and Space Act of 1958, Public Law 85-568 ( 72 Stat. 435; 45 USC 2457). -- .

Signed and sealed this 6th day of August 1974.

(SEAL)
Attest:

McCOY M. GIBSON, JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334.